United States Patent
Lee et al.

(10) Patent No.: US 8,264,026 B2
(45) Date of Patent: Sep. 11, 2012

(54) NONVOLATILE MEMORY DEVICES AND METHODS OF MANUFACTURING THE SAME

(75) Inventors: Sung-Hae Lee, Yongin-si (KR); Byong-Sun Ju, Seongnam-si (KR); Suk-Jin Chung, Hwaseong-si (KR); Young-Sun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 12/694,655

(22) Filed: Jan. 27, 2010

(65) Prior Publication Data

US 2010/0187595 A1     Jul. 29, 2010

(30) Foreign Application Priority Data

Jan. 28, 2009   (KR) ................. 10-2009-0006666

(51) Int. Cl.
*H01L 21/336*   (2006.01)
*H01L 29/76*    (2006.01)

(52) U.S. Cl. . 257/321; 257/324; 257/325; 257/E29.304; 257/E29.309; 257/E21.423; 438/261; 438/264; 438/594

(58) Field of Classification Search ............ 257/321, 257/324, 325, E29.304, E29.309, E21.423, 257/E21.679; 438/261, 264, 594
See application file for complete search history.

(56) References Cited

U.S. PATENT DOCUMENTS

| | | | |
|---|---|---|---|
| 7,034,355 B2 | 4/2006 | Miki | |
| 7,517,750 B2* | 4/2009 | Choi et al. | 438/211 |
| 2008/0085583 A1 | 4/2008 | Park et al. | |
| 2009/0078984 A1* | 3/2009 | Nagano et al. | 257/316 |

FOREIGN PATENT DOCUMENTS

| | | |
|---|---|---|
| JP | 2003-168749 A | 6/2003 |
| KR | 10-0757324 B1 | 9/2007 |
| KR | 10-2007-0106165 A | 11/2007 |

* cited by examiner

*Primary Examiner* — Minh-Loan T Tran
(74) *Attorney, Agent, or Firm* — Myers Bigel Sibley & Sajovec, P.A.

(57) ABSTRACT

Nonvolatile memory devices and related methods of manufacturing the same are provided. A nonvolatile memory device includes a tunneling layer on a substrate, a floating gate on the tunneling layer, an inter-gate dielectric layer structure on the floating gate, and a control gate on the inter-gate dielectric layer structure. The inter-gate dielectric layer structure includes a first silicon oxide layer, a high dielectric layer on the first silicon oxide layer, and a second silicon oxide layer on the high dielectric layer opposite to the first silicon oxide layer The high dielectric layer may include first and second high dielectric layers laminated on each other, and the first high dielectric layer may have a lower density of electron trap sites than the second high dielectric layer and may have a larger energy band gap or conduction band-offset than the second high dielectric layer.

17 Claims, 8 Drawing Sheets

NONVOLATILE MEMORY DEVICES AND METHODS OF MANUFACTURING THE SAME

CROSS-REFERENCE TO RELATED APPLICATION

This application is based on and claims priority from Korean Patent Application No. 10-2009-0006666, filed on Jan. 28, 2009 in the Korean Intellectual Property Office, the disclosure of which is incorporated herein in its entirety by reference.

BACKGROUND

1. Field of the Invention

The present invention relates to nonvolatile memory devices and methods of manufacturing the same, and more particularly to nonvolatile memory devices that include a multilayered inter-gate dielectric layer structure and methods of manufacturing the same.

2. Description of the Prior Art

Memory devices are used in a wide variety of apparatuses, such as microcontrollers, credit cards, and the like. A memory device can be classified into a volatile memory device, such as a DRAM, an SRAM, and the like, in which data input/output access can be performed quickly, but data is lost with loss of power, and a nonvolatile memory device, such as a ROM, in which data input/output is performed relatively slowly, but data can be more permanently retained absent power.

Another type of nonvolatile memory device is the EEPROM which is typically used in a flash memory devices and the like. Such an EEPROM or flash memory device, for example, has a structure in which a tunneling layer, a floating gate, an inter-gate dielectric layer structure, and a control gate electrode are sequentially formed on a semiconductor substrate. The floating gate is designed so that a coupling voltage is applied from the control gate electrode to the floating gate to produce an electric potential difference between the floating gate and the semiconductor substrate, and electrons are injected from the semiconductor substrate to the floating gate. However, the voltage coupling effect being applied to the floating gate is influenced by capacitance between the control gate electrode and the floating gate. In order to enable electrons to be injected even at low voltages, it is desirable that the voltage coupling effect is large.

SUMMARY

Some embodiments of the present invention may provide nonvolatile memory devices having improved reliability and related methods of manufacturing such nonvolatile memory devices. Other potential advantages, objects, and features of various embodiments of the present invention will be set forth in part in the description which follows and in part will become apparent to those having ordinary skill in the art upon examination of the following or may be learned from practice of the invention.

In accordance with some embodiments, a nonvolatile memory device includes a tunneling layer on a substrate, a floating gate on the tunneling layer, an inter-gate dielectric layer structure on the floating gate, and a control gate on the inter-gate dielectric layer structure. The inter-gate dielectric layer structure includes a first silicon oxide layer, a high dielectric layer on the first silicon oxide layer, and a second silicon oxide layer on the high dielectric layer opposite to the first silicon oxide layer The high dielectric layer includes first and second high dielectric layers laminated on each other, and the first high dielectric layer has a lower density of electron trap sites than the second high dielectric layer and has a larger energy band gap or conduction band-offset than the second high dielectric layer.

In some further embodiments, the density of electron trap sites of the first high dielectric layer is not more than half of the density of electron trap sites of the second high dielectric layer, and the density of electron trap sites of the first high dielectric layer is not more than $1019/cm^3$.

In some further embodiments, the first high dielectric layer comprises an aluminum oxide layer or an aluminum oxynitride layer, and the second high dielectric layer comprises a silicon nitride layer or a silicon oxynitride layer.

In some further embodiments, the silicon nitride layer or the silicon oxynitride layer is laminated on the aluminum oxide layer or the aluminum oxynitride layer.

In some further embodiments, the aluminum oxide layer or the aluminum oxynitride layer is further laminated on the silicon nitride layer or the silicon oxynitride layer.

In some further embodiments, the floating gate includes polysilicon doped with n-type or p-type impurities.

In some other embodiments, a method of manufacturing a nonvolatile memory device includes forming a tunneling layer on a substrate. A floating gate is formed on the tunneling layer. An inter-gate dielectric layer structure is formed by sequentially laminating a first silicon oxide layer, a high dielectric layer, and a second silicon oxide layer on the floating gate. A control gate is formed on the inter-gate dielectric layer structure. Formation of the high dielectric layer includes forming a first high dielectric layer on the first silicon oxide layer and forming a second high dielectric layer on the first high dielectric layer. The first and second high dielectric layers have a different density of electron trap sites and have a different energy band gap or a different conduction band-offset than each other.

In some further embodiments, the second high dielectric layer has a lower density of electron trap sites than the first high dielectric layer and a larger energy band gap or conduction band-offset than the first high dielectric layer.

In some further embodiments, the first high dielectric layer includes an aluminum oxide layer or an aluminum oxynitride layer, and the second high dielectric layer comprises a silicon nitride layer or a silicon oxynitride layer.

In some further embodiments, a third high dielectric layer, which has a lower density of electron trap site than the second high dielectric layer and a larger energy band gap or conduction band-offset than the second high dielectric layer, is formed on the second high dielectric layer after forming the second high dielectric layer.

In some further embodiments, the density of electron trap sites of the first high dielectric layer is not more than half of the density of electron trap sites of the second high dielectric layer, and the density of electron trap sites of the first high dielectric layer is not more than 1019/cm3.

In some other embodiments, a nonvolatile memory device includes a tunneling layer on a substrate, a floating gate on the tunneling layer, an inter-gate dielectric layer structure on the floating gate, and a control gate on the inter-gate dielectric layer structure. The inter-gate dielectric layer structure includes a first silicon oxide layer, a high dielectric layer on the first silicon oxide layer, and a second silicon oxide layer on the high dielectric layer opposite to the first silicon oxide layer. The high dielectric layer includes first and second high dielectric layers laminated on each other, and the density of electron trap sites of the first high dielectric layer is not more than half of the density of electron trap sites of the second high dielectric layer, and the density of electron trap sites of the first high dielectric layer is not more than $10^{19}/cm^3$.

In some further embodiments, the first high dielectric layer has a larger energy band gap or conduction band-offset than the second high dielectric layer.

In some further embodiments, the first high dielectric layer comprises an aluminum oxide layer and/or an aluminum oxynitride layer, and the second high dielectric layer comprises a silicon nitride layer and/or a silicon oxynitride layer.

In some further embodiments, the silicon nitride layer and/or the silicon oxynitride layer is laminated on the aluminum oxide layer and/or the aluminum oxynitride layer.

In some further embodiments, the aluminum oxide layer or the aluminum oxynitride layer is further laminated on the silicon nitride layer or the silicon oxynitride layer.

In some further embodiments, the floating gate includes polysilicon doped with n-type or p-type impurities.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Figure 1:
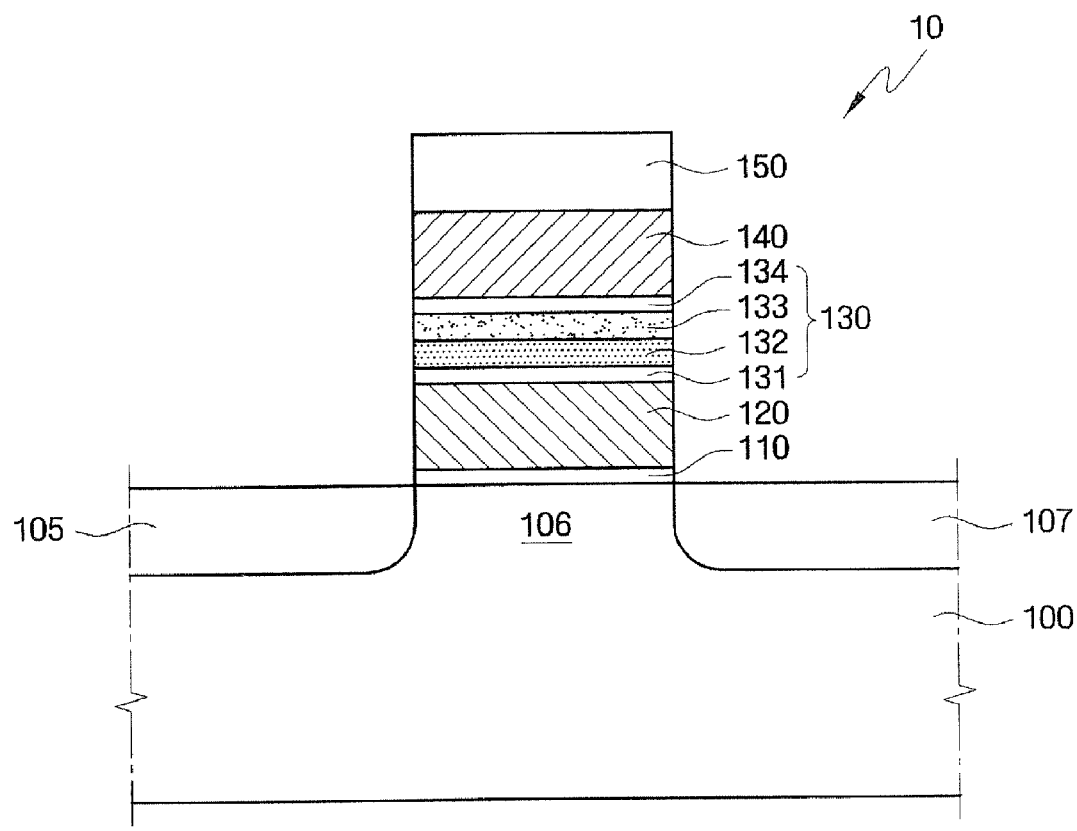
FIG. 1 is a sectional view of a nonvolatile memory device according to some embodiments of the present invention.

Hereinafter, preferred embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are specific details provided to assist those of ordinary skill in the art in a comprehensive understanding various embodiments of the invention, and the present invention is only defined within the scope of the appended claims. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element. By contrast, the term "directly on" means that an element is directly on another element or a layer without intervention of any other element or layer. In the entire description of the present invention, the same drawing reference numerals are used for the same elements across various figures. Also, the term "and/or" includes the respective described items and combinations thereof.

Spatially relative wordings "below". "beneath", "lower", "above", "upper", and so forth, as illustrated in the drawings, may be used to facilitate the description of relationships between an element or constituent elements and another element or other constituent element. The spatially relative wordings should be understood as wordings that include different directions of the element in use or operation in addition to the direction illustrated in the drawings. In the entire description of the present invention, the same drawing reference numerals are used for the same elements across various figures.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description of the present invention, embodiments of the present invention will be described with reference to plane views and sectional views which are ideal schematic views. The form of exemplary views may be modified due to the manufacturing techniques and/or allowable errors. Accordingly, the embodiments of the present invention are not limited to their specified form as illustrated, but include changes in form being produced according to manufacturing processes. Accordingly, areas exemplified in the drawings have rough properties, and the shapes of areas in the drawings are to exemplify specified forms of areas of elements, but do not limit the scope of the present invention.

Unless specially defined, all terms (including technical and scientific terms) used in the description could be used as meanings commonly understood by those ordinary skilled in the art to which the present invention belongs. In addition, terms that are generally used but are not defined in the dictionary are not interpreted ideally or excessively unless they have been clearly and specially defined.

First, with reference to FIG. 1, a nonvolatile memory device according to some embodiments of the present invention will be described. FIG. 1 is a sectional view of a nonvolatile memory device according to some embodiments of the present invention.

A nonvolatile memory element 10 according to some embodiments of the present invention includes a tunneling layer 110 formed on a substrate 100, a floating gate 120, an inter-gate dielectric layer structure 130, and a control gate 140. The inter-gate dielectric layer structure 130 includes a first silicon oxide layer 131, high dielectric layers 132 and 133, and a second silicon oxide layer 134, which are sequentially laminated on the floating gate 120.

The tunneling layer 110 is formed on the substrate 100, and the floating gate 120 is formed on the tunneling layer 110. The inter-gate dielectric layer structure 130 is formed on the floating gate 120, and the control gate 140 is formed on the inter-gate dielectric layer structure 130. As illustrated in the drawing, a mask pattern 150 may be formed on the control gate 140.

The substrate 100 may be a silicon substrate, a silicon on insulator (SOI) substrate, or a silicon germanium substrate. However, this is merely exemplary, and another material may be used as the substrate 100 according to the intended purpose of the substrate. Although not illustrated in the drawing, the substrate 100 may include an element isolation region (not illustrated) for defining an active region. In this case, the element isolation region may be formed of shallow trench isolation (STI) or field oxide (FOX).

In the substrate 100, source/drain regions 105 and 107 may be formed to be spaced apart from each other. The source/drain regions 105 and 107 may be doped with p-type or n-type impurities, and a channel region 106 may be formed between a pair of source/drain regions 105 and 107 facing each other. Although not illustrated in the drawing, the source/drain regions 105 and 107 may have a double diffused drain (DDD) or lightly doped drain (LDD) structure.

On the substrate 100, the tunneling layer 110, the floating gate 120, the inter-gate dielectric layer structure 130, and the control gate 140 are sequentially laminated. In this case, the tunneling layer 110, the floating gate 120, the inter-gate dielectric layer structure 130, and the control gate 140 may be formed on the channel region 106.

The tunneling layer 110 is interposed between the substrate 100 and the floating gate 120 to provide an energy barrier to tunneling of electrons. That is, the tunneling layer 110 can provide a movement path of electric charge during programming and erasing operations. For example, the tunneling layer 110 may be a silicon oxide layer or a silicon oxynitride layer, and may be formed through a thermal oxidation process. Also, the thickness of the tunneling layer 110 may be, for example, about 60 Å or more.

The floating gate 120 can retain electrons injected from the substrate 100 through the tunneling layer 110. That is, the floating gate 120 may be a conductor for storing information. For example, the floating gate 120 may be formed of polysilicon having conductivity, and specifically, may be a polysilicon layer doped with n-type or p-type impurities. However, this is merely exemplary, and materials of the floating gate 120 are not limited to those as described above.

The inter-gate dielectric layer structure 130 is interposed between the floating gate 120 and the control gate 140, and can make the floating gate 120 and the control gate 140 electrically insulated from each other. That is, the inter-gate dielectric layer structure 130 can inhibit/prevent electrons stored in the floating gate 120 from being emitted to the control gate 140, or inhibit/prevent electrons of the control gate 140 from being injected into the floating gate 120.

The inter-gate dielectric layer structure 130 has a structure in which the first silicon oxide layer 131, the high dielectric layers 132 and 133, and the second silicon oxide layer 134 are sequentially laminated, and the high dielectric layers 132 and 133 include first and second high dielectric layers laminated on each other. In this case, the first high dielectric layer 132 may be laminated to be in contact with the first silicon oxide layer 131, and the second high dielectric layer 133 may be laminated on the first high dielectric layer 132.

In general, the ratio of a voltage being applied to the tunneling layer to a voltage being applied to the control gate 140 in a floating gate type nonvolatile memory device may be represented as a coupling ratio $\gamma$ in the following Equation (1).

$$\gamma = \frac{C_{IPD}}{C_{Tu\text{-}Ox} + C_{IPD} + C_{para}} \quad (1)$$

Here, CIPD denotes capacitance of the inter-gate dielectric layer structure 130, CTu-Ox denotes capacitance of the tunneling layer 110, and Cpara denotes parasitic capacitance of a neighboring cell.

In this case, as the size of the nonvolatile memory device becomes small, the parasitic capacitance may be increased. In order to prevent the decrease of the coupling ratio, which is caused by the parasitic capacitance, the capacitance CIPD of the inter-gate dielectric layer structure 130 may be increased, or the capacitance CTu-Ox of the tunneling layer 110 may be decreased. However, since there may be a limitation to decreasing the thickness of the tunneling layer 110 to secure the reliability against the leakage current, the coupling ratio can be improved by increasing the capacitance CIPD of the inter-gate dielectric layer structure 130.

In order to increase the capacitance CIPD of the inter-gate dielectric layer structure 130, there is a scheme for decreasing the equivalent oxide thickness (EOT) of the inter-gate dielectric layer structure 130. Here, the equivalent oxide thickness (EOT) may mean the thickness of $SiO_2$ to have the same capacitance.

Accordingly, the first and second high dielectric layers 132 and 133 are made of a high dielectric material having a relatively high dielectric constant, and thus the equivalent oxide thickness can be decreased. In this case, the relatively high dielectric constant may mean the dielectric constant that is higher than that of $SiO_2$. For example, if the dielectric constant of $SiO_2$ is about 3.9, the dielectric constant of the first and second high dielectric layers 132 and 133 may be higher than 3.9, for example, may be 7 or higher.

The first high dielectric layer 132 has a lower density of electron trap site than the second high dielectric layer 133 and a larger energy band gap or conduction band-offset than the second high dielectric layer 133.

The band-offset may mean a difference between energy band values, which occurs due to the discontinuity of an energy band on a boundary surface of hetero junction. As the conductive band-offset value becomes larger, the tunneling of electrons becomes more difficult.

That is, the first high dielectric layer 132 has a larger energy band gap or conduction band-offset than the second high dielectric layer 133, and thus the tunneling phenomenon of electrons moving from the floating gate 120 can be decreased. Accordingly, the reliability of the nonvolatile memory device can be improved. Also, the second high dielectric layer 133 has a higher density of electron trap site than the first high dielectric layer 132, and thus the electrons are trapped in the second high dielectric layer 133 to buffer the electrical stress.

Accordingly, even if the thickness of the first and second silicon oxide layers 134 is decreased in order to decrease the equivalent oxide thickness (EOT), the reliability of the memory device is prevented from deteriorating, and the resistivity against the electrical stress is good. In this case, the first high dielectric layer 132 may be, for example, an aluminum oxide layer, and the second high dielectric layer 133 may be, for example, a silicon nitride layer.

More specifically, the density of electron trap site of the first high dielectric layer 132 may be about ⅕ of the density of electron trap site of the second high dielectric layer 133. Since the density of electron trap site of the first high dielectric layer 132 is low, the electron trap phenomenon in the first high dielectric layer 132 is decreased to reduce the leakage current due to the electron trap in the layer, and thus the reliability of the memory device may be improved.

For example, in the case in which the first high dielectric layer 132 is an aluminum oxide layer and the second high dielectric layer 133 is a silicon nitride layer, the density of electron trap site is lower than that of a case in which both the high dielectric layers 132 and 133 are silicon nitride layers, and thus the reliability of the memory device may be further improved. In this case, with respect to the aluminum oxide layer and the silicon nitride layer having the same thickness, the density of electron trap site of the aluminum oxide layer may be about 1/5 of the density of electron trap site of the silicon nitride layer. However, this is merely exemplary, and the densities of electron trap site according to the present invention are not limited thereto.

As described above, the density of electron trap sites of the second high dielectric layer 133 can be configured to be higher than the density of electron trap site of the first high dielectric layer 132. Accordingly, electrons that pass through the first high dielectric layer 132 become trapped in the second high dielectric layer 133 due to its higher density of electron trap sites than the first high dielectric layer 132 and thus, can buffer the electrical stress.

When the second high dielectric layer 133 is a silicon nitride layer, the content ratio of nitrogen to silicon of the silicon nitride layer may be, for example, about 3:4.

Although FIG. 1 and the associated specification describe the first high dielectric layer 132 and the second high dielectric layer 133 as being laminated in that order on the first silicon nitride layer 131, the second high dielectric layer 133 may be laminated to be in contact with the first silicon oxide layer 131 and the first high dielectric layer 132 may be formed on the first high dielectric layer 132. That is, the second high dielectric layer 133 and the first high dielectric layer 132 may be successively laminated on the first silicon oxide layer 131.

The control gate 140 may have a structure in which one or more of a polysilicon layer doped with n-type or p-type impurities, a metal layer, and a metal silicide layer are laminated. Metal that may be included in the control gate 140 can include one or more of tungsten (W), cobalt (Co), nickel (Ni), titanium (Ti), tantalum (Ta), and the like.

According to some embodiments of the present invention, the high dielectric layer is formed to include the first high dielectric layer having a lower electron trap density than the second high dielectric layer and a larger energy band gap or conduction band-offset than the second high dielectric layer, which may improve the reliability of the memory device. The resistivity relative to the electrical stress may also be improved.

With reference now to FIGS. 2 to 6, methods of manufacturing nonvolatile memory devices according to some embodiments of the present invention are described.

FIGS. 2 to 6 are sectional views of an intermediate structure showing methods of manufacturing nonvolatile memory devices according to some embodiments of the present invention. For convenience in explanation, explanation of the above-described constituent elements will be omitted or simplified.

Figure 2:
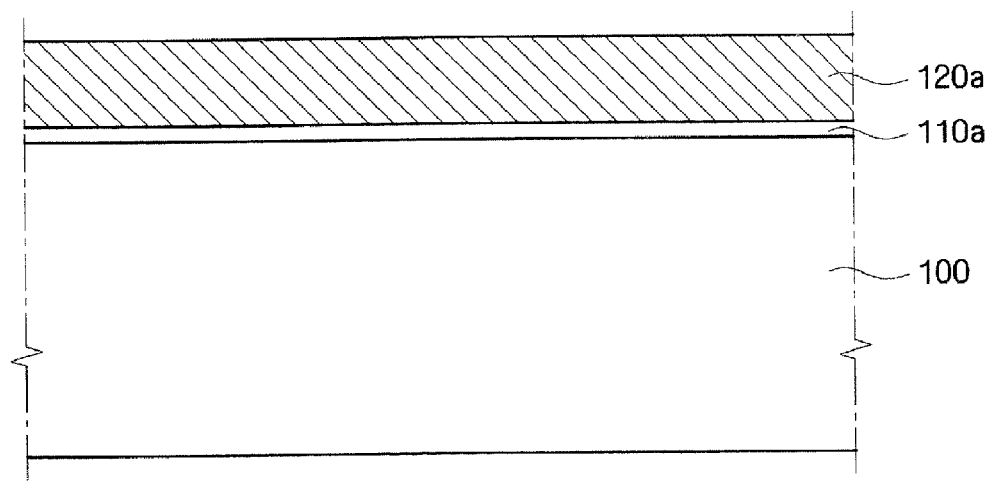
FIGS. 2 to 6 are sectional views of an intermediate structure explaining methods of manufacturing a nonvolatile memory device according to some embodiments of the present invention.

First, referring to FIG. 2, plural active regions are defined through forming of element isolation regions (not illustrated) in the substrate 100. Then, a tunneling layer 110a is formed on a substrate 100, and then a floating gate layer 120a is laminated on the tunneling layer 120a. Here, the tunneling layer 110, for example, may be formed by performing a thermal oxidation process.

The floating gate layer 120a may be formed of a polysilicon layer doped with n-type or p-type impurities. For example, the floating gate layer 120a can be formed by injecting n-type or p-type impurity ions after forming a polysilicon layer. Also, a source gas for forming the impurity ions and the polysilicon layer can be formed by in-situ method.

Figure 3:
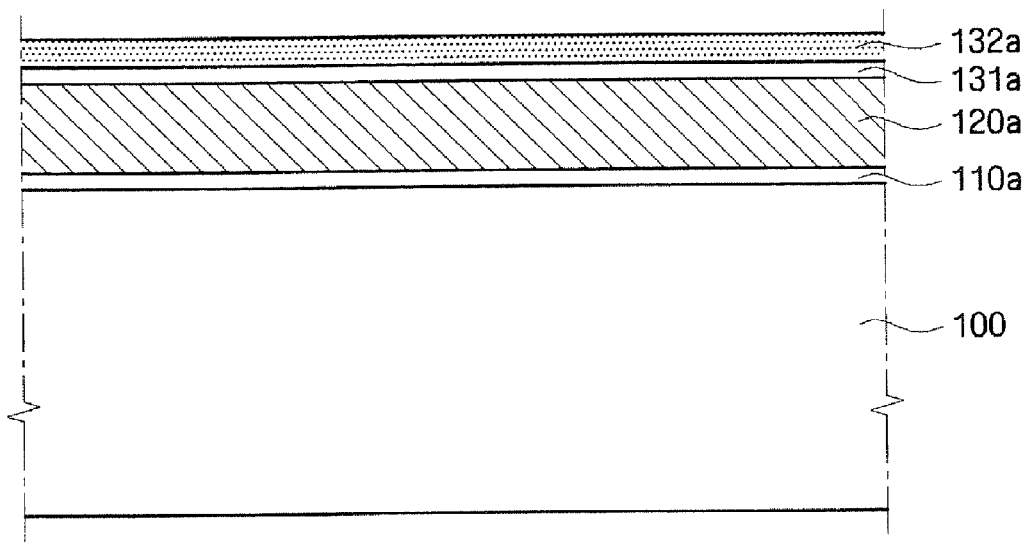

Referring to FIG. 3, a first silicon oxide layer 131a is formed on the floating gate 120a, and a first high dielectric layer 132a is formed on the first silicon oxide layer 131a.

The first silicon oxide layer 131a may be formed, for example, by depositing the first silicon oxide layer on the floating gate 120a using chemical vapor deposition (CVD), plasma enhanced CVD (PECVD), physical vapor deposition (PVD), atomic layer deposition (ALD), plasma enhanced ALD (PEALD), and the like.

The first high dielectric layer 132a may be formed, for example, by depositing the first high dielectric layer on the first silicon oxide layer 131a by ALD or CVD. For example, it is assumed that the first high dielectric layer 132a is an aluminum oxide layer. First, the substrate 100, on which the first silicon oxide layer 131a is formed, is arranged in a process chamber, and an aluminum precursor material is supplied into the process chamber under specified temperature and pressure, so that the aluminum precursor can be adsorbed on the first silicon oxide layer 131 a. In this case, tri methyl aluminum (TMA), dimethyl aluminum hydride (DMAH), dimethyl aluminum hydride ethyl piperidine (DMAH-EPP). and/or the like, may be used as the aluminum precursor material.

Thereafter, a purge gas, such as $N_2$, He, and/or Ar gas, is provided into the process chamber to remove the precursor remaining in the process chamber. Then, an oxidation gas, such as $O_2$, $O_3$, $H_2O$, NO, $NO_2$, and/or $N_2O$, is provided into the process chamber to oxidize the aluminum precursor adsorbed on the first silicon oxide layer 131a. By repeating the above-described processes, the aluminum oxide layer can be formed on the first silicon oxide layer 131a with a proper thickness. For example, the first high dielectric layer 132a can be formed with a thickness of about 5 to 50 Å.

Figure 4:
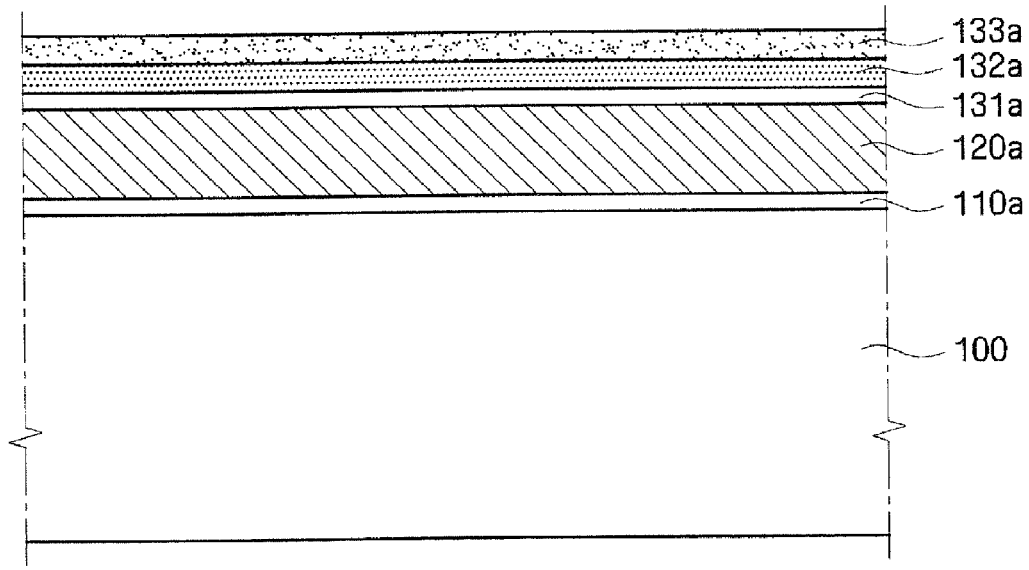

Referring to FIG. 4, a second high dielectric layer 133a is formed on the first high dielectric layer 132a. In this case, the second high dielectric layer 133a can be formed by performing a separate deposition process after the first high dielectric layer 132a is formed. In other words, the second high dielectric layer 133a is formed by performing a deposition process on the first high dielectric layer 132a already formed, without sacrificing a part of the first high dielectric layer 132a, for example, without passing through a plasma processing of a part of the first high dielectric layer 132a.

The second high dielectric layer 133a may be, for example, a silicon nitride layer. The second high dielectric layer 133a may be formed by CVD, PECVD, and/or PVD. In the case in which the second high dielectric layer 133aq is a silicon nitride layer, the silicon nitride layer can be formed on the first high dielectric layer 132a by providing a silicon source gas and nitrogen gas into the process chamber. For example, the second high dielectric layer 133a can be formed with a thickness of about 5 to about 50 Å.

Figure 5:
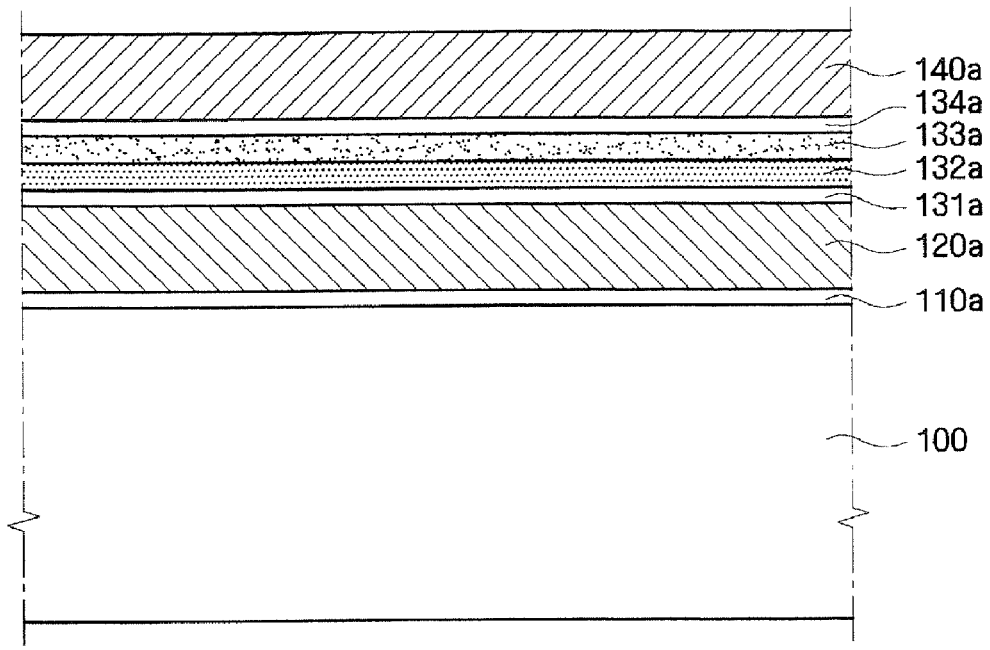

Referring to FIG. 5, a second silicon oxide layer 134a and a control gate layer 140a are successively laminated on the second high dielectric layer 133a. More specifically, the second silicon oxide layer 134a may be formed in a method substantially the same as the method of forming the first silicon oxide layer 131a as described above. For example, the second silicon oxide layer 134a may be formed, for example, by depositing the second silicon oxide layer on the floating gate 120a using chemical vapor deposition (CVD), plasma enhanced CVD (PECVD), physical vapor deposition (PVD), atomic layer deposition (ALD), plasma enhanced ALD (PEALD, and/or the like.

Then, a control gate layer 140a is formed on the second silicon oxide layer 134a. The control gate layer 140a, for example, may be formed of a polysilicon layer, a metal layer, and/or a metal silicide layer.

Figure 6:
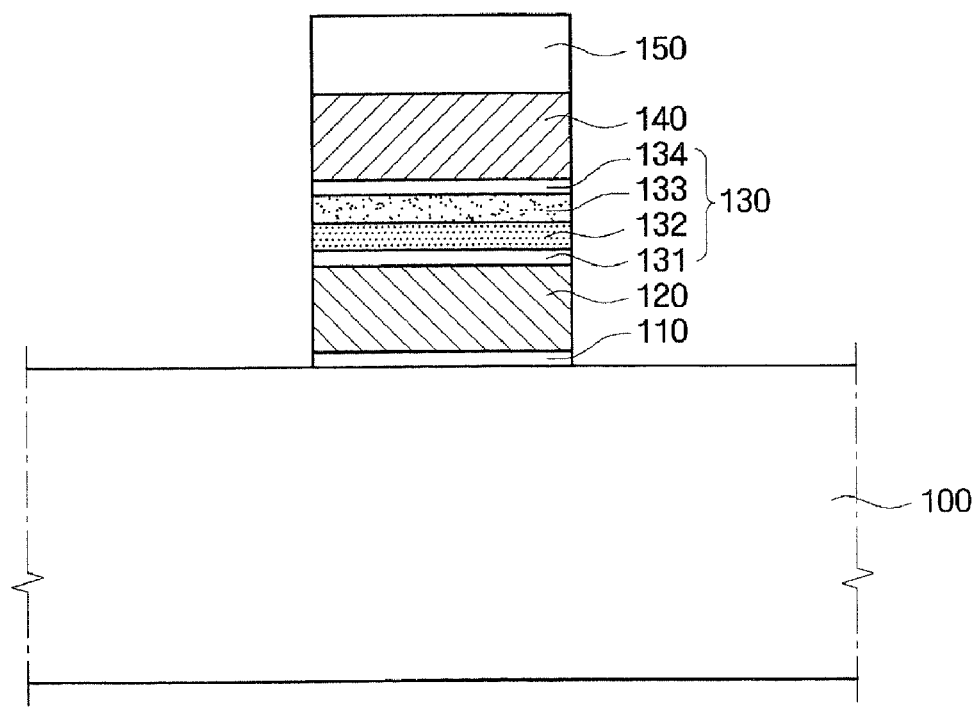

Referring to FIG. 6, a mask pattern 150 is formed on the control gate layer 140a, and the control gate layer 140a, the high dielectric layers 132a and 133a, the floating gate layer 120a, and the tunneling layer 110 are sequentially patterned using the mask pattern 150.

Then, referring again to FIG. 1, by injecting impurity ions into the substrate 100, a patterned control gate 140, the inter-gate dielectric layer structure 130, the floating gate layer 140a, and the source/drain regions 105 and 107 on both sides of the tunneling layer 110 on the substrate 100 can be formed.

According to the method of manufacturing nonvolatile memory devices according to some embodiments of the present invention, since the high dielectric layer is formed to include the first and second high dielectric layers, the reliability of the memory device may be further improved, and the resistivity relative to the electrical stress may be improved.

Figure 7:
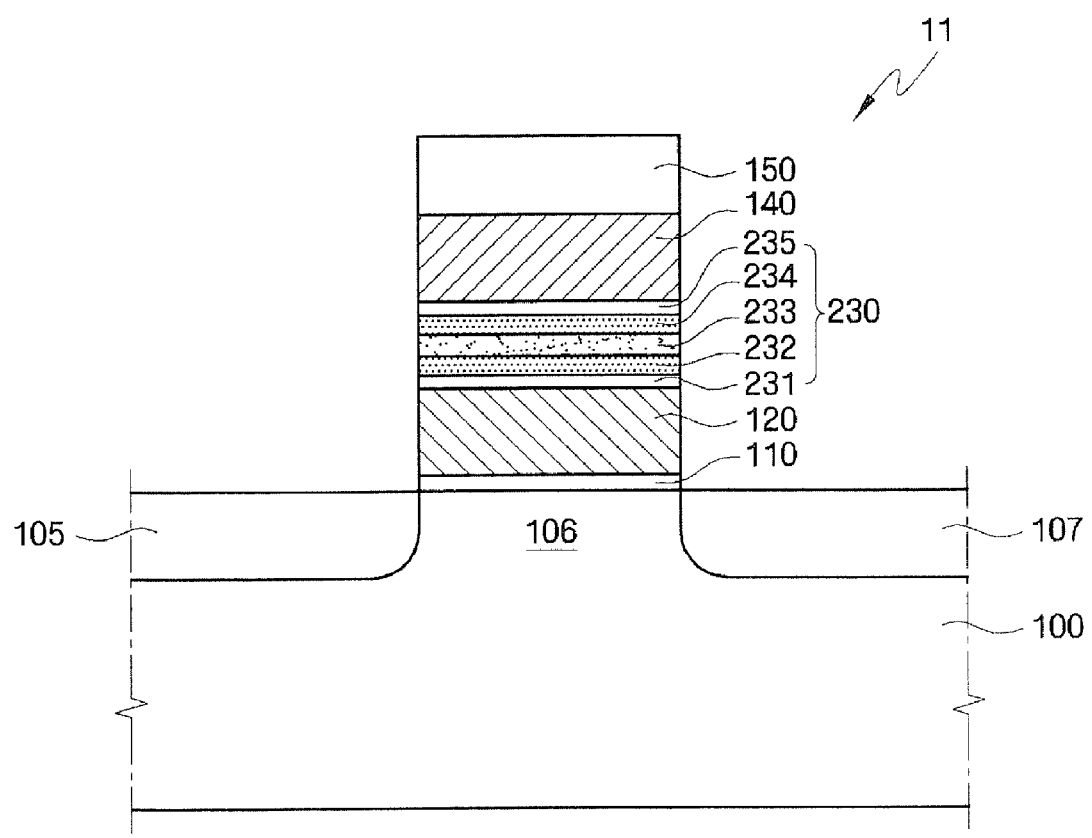
FIG. 7 is a sectional view of a nonvolatile memory device according to some other embodiments of the present invention.

With reference to FIG. 7, a nonvolatile memory device and related methods of manufacturing the same according to some other embodiments of the present invention will be described. FIG. 7 is a sectional view of a nonvolatile memory device according to some other embodiments of the present invention.

Referring to FIG. 7, a nonvolatile memory device 11 according to some other embodiments of the present invention further includes a first high dielectric layer 234 formed on the second high dielectric layer 233. Accordingly, the constituent elements of the nonvolatile memory device according to another embodiment of the present invention, except for the inter-gate dielectric layer structure 130, are substantially the same as those of the nonvolatile memory according to the above-described embodiment, and thus the explanation thereof will be omitted.

An inter-gate dielectric layer structure 230 of the nonvolatile memory device 11 according to another embodiment of the present invention is formed by sequentially laminating a first silicon oxide layer 231, high dielectric layers 232, 233, and 234, and a second silicon oxide layer 235. In this case, the high dielectric layers 232, 233, and 234 include first and second high dielectric layers 232, 233, and 234. Specifically, the first high dielectric layer 232 is formed on the first silicon oxide layer 231, the second high dielectric layer 233 is formed on the first high dielectric layer 232, and the first high dielectric layer 234 is further formed on the second high dielectric layer 233.

For example, in the case in which the first high dielectric layers 232 and 234 are aluminum oxide layers, and the second high dielectric layer 233 is a silicon nitride layer, the inter-gate dielectric layer structure 230 is formed on the floating gate 120 by laminating the first silicon oxide layer 231, an aluminum oxide layer, a silicon nitride layer, an aluminum oxide layer, and a second silicon oxide layer 235 in order. In the drawings it is shown that the high dielectric layers 232, 233, and 234 are laminated in the order of the aluminum oxide layer, the silicon nitride layer, and the aluminum oxide layer. However, the high dielectric layers 232, 233, and 234 may alternatively be laminated in other orders, such as in the order of silicon nitride layer, aluminum oxide layer, and silicon nitride layer. That is, the second high dielectric layer 233 may be formed on the first silicon oxide layer 231, the first high dielectric layer 232 may be formed on the second high dielectric layer 233, and then the second high dielectric layer 234 may be formed on the first high dielectric layer 232 again.

The methods of manufacturing a nonvolatile memory device according the embodiments of FIG. 7 is substantially the same as the methods of manufacturing the nonvolatile memory device according FIG. 1, and includes forming again the first high dielectric layer 234 on the second high dielectric layer 233a after forming the second high dielectric layer 233a, and forming the second silicon oxide layer 235 and the control gate layer 140a on the first high dielectric layer 234. Because these methods can be understood by one of ordinary skill in the art to which the present invention pertains in view of the present explanations, the detailed description of the method of manufacturing the nonvolatile memory device of FIG. 7 is therefore omitted.

Although a floating gate type nonvolatile memory device including first and second high dielectric layers according to some embodiments of the present invention has been described, the type of nonvolatile memory device is not limited thereto. For example, in some other embodiments, the nonvolatile memory device may be a charge trap type device that includes a tunnel dielectric layer, a charge trap layer, a blocking dielectric layer, and an upper electrode. In such a charge trap type nonvolatile memory device, the tunnel dielectric layer, the charge trap layer, the blocking dielectric layer, and the upper electrode may correspond to the tunneling layer, the floating gate, the inter-gate dielectric layer structure, and the control gate, respectively. In still another embodiment of the present invention, the blocking dielectric layer may be fabricated to have substantially the same configuration as the inter-gate dielectric layer structure as described above with reference to FIGS. 1 to 7.

Further features of the various embodiments of the present invention will be described with regard to the following experimental example configurations.

Experimental Example 1

A first experiment was carried out on first and second comparative example configurations, which include different inter-gate dielectric layer structures between a floating gate and a control gate. The floating gates and the control gates in the first and second example configurations were formed of the same material, but the inter-gate dielectric layer structures, particularly only the high dielectric layers, were formed differently.

In the first example configuration, a silicon oxide layer, an aluminum oxide layer, a silicon nitride layer, and a silicon oxide layer (hereinafter referred to as "OANO laminated structure") were laminated on the floating gate with thicknesses of 4 nm, 3 nm, 3 nm, and 5 nm, respectively. A silicon oxide layer, a silicon nitride layer, and a silicon oxide layer (hereinafter referred to as "ONO laminated structure") were laminated with thicknesses of 4 nm, 6 nm, and 5 nm, respectively.

In the second example configuration, a silicon oxide layer, an aluminum nitride layer, and a silicon oxide layer (hereinafter referred to as "OAO laminated structure") were laminated with thicknesses of 4 nm, 5 nm, and 5 nm, respectively.

Figure 8:
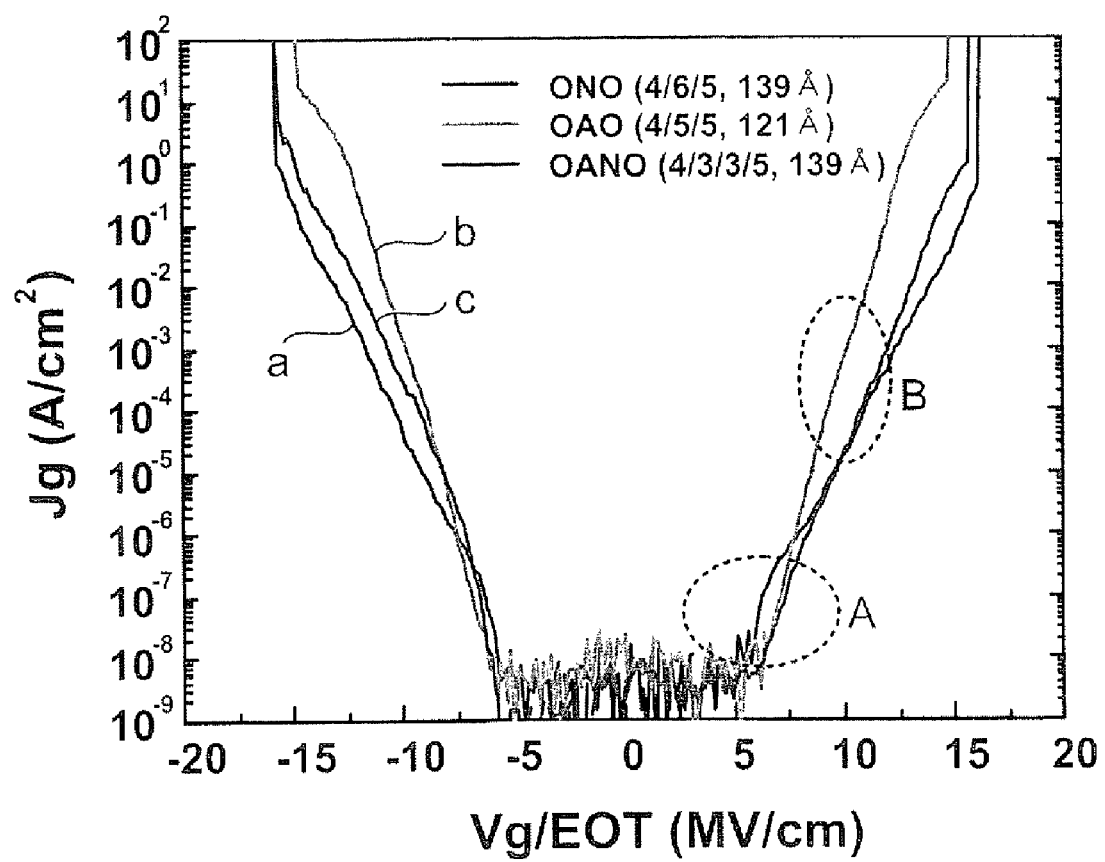
FIG. 8 is a graph showing the leakage current relative to the voltage being applied to a floating gate in a first experimental example and first and second comparative examples.

Leakage current in the first example configuration was measured while changing the voltage being applied to the floating gate, and the results are illustrated in FIG. 8. In FIG. 8, the x-axis represents the voltage being applied to the floating gate with respect to the equivalent oxide thickness (EOT) of 1 cm (unit MV/cm), while the y-axis represents the leakage current (unit $A/cm^2$).

Referring to FIG. 8, the leakage current form c of the OANO laminated structure was determined to be near to the leakage current form b of the OAO laminated structure in a region A in which the applied voltage is below 6 MV/cm., and to be near to the leakage current form a of the ONO laminated structure in a region B in which the applied voltage is over 6 MV/cm. Accordingly, relatively small leakage current flows in the ONO laminated structure and the OAO laminated structure having physically similar thicknesses.

Accordingly, the OANO laminated structure has a smaller leakage current than the ONO laminated structure in a low-voltage region, e.g. in the region A in which the applied voltage is below 6 MV/cm, while it has a smaller leakage current than the OAO laminated structure in a high-voltage region, e.g. in the region B in which the applied voltage is over 6 MV/cm.

Experimental Example 2

Figure 9:
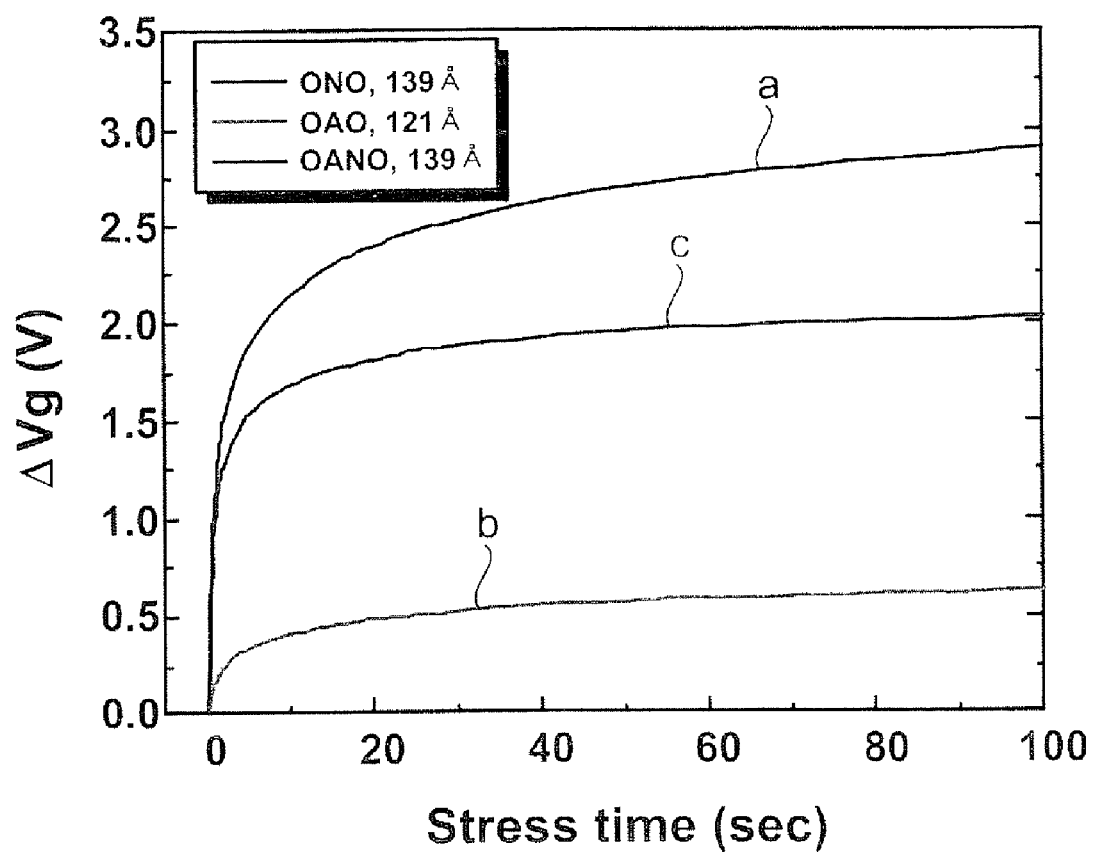
FIG. 9 is a graph showing the degree of electron trap relative to the electrical stress in a second experimental example and first and second comparative examples.

Another experiment was carried out to determine the amount of electron trap relative to the electrical stress with respect to a second experimental example having first and second example configurations with the same constitution and thickness as the first experimental example. With regard to electrical stress, a constant current of 5E-6 A/cm$^2$ was applied. The change in the voltage ΔVg being applied to the control gate relative time was measured, and the results are illustrated in FIG. 9. In FIG. 9, the x-axis represents the stress time for which the electrical stress was applied (unit sec), while the y-axis represents the change of voltage being applied to the control gate (unit V). As shown in FIG. 9, as the voltage change ΔVg becomes larger the number of electrons being trapped in the layer is increased.

Referring to FIG. 9, the OAO laminated structure b has an electron trap site reduced to about ⅕ in comparison to the ONO laminated structure a. By contrast, the OANO laminated structure c has an electron trap site reduced to about ⅓ of the ONO laminated structure a. Thus, the electron trap site is increased relative to the OAO laminated structure b.

Experimental Example 3

Another experiment was carried out to determine the amount of leakage current relative to the electrical stress with respect to another embodiment having the same constitution and thickness as the experimental example 1.

Figure 10:
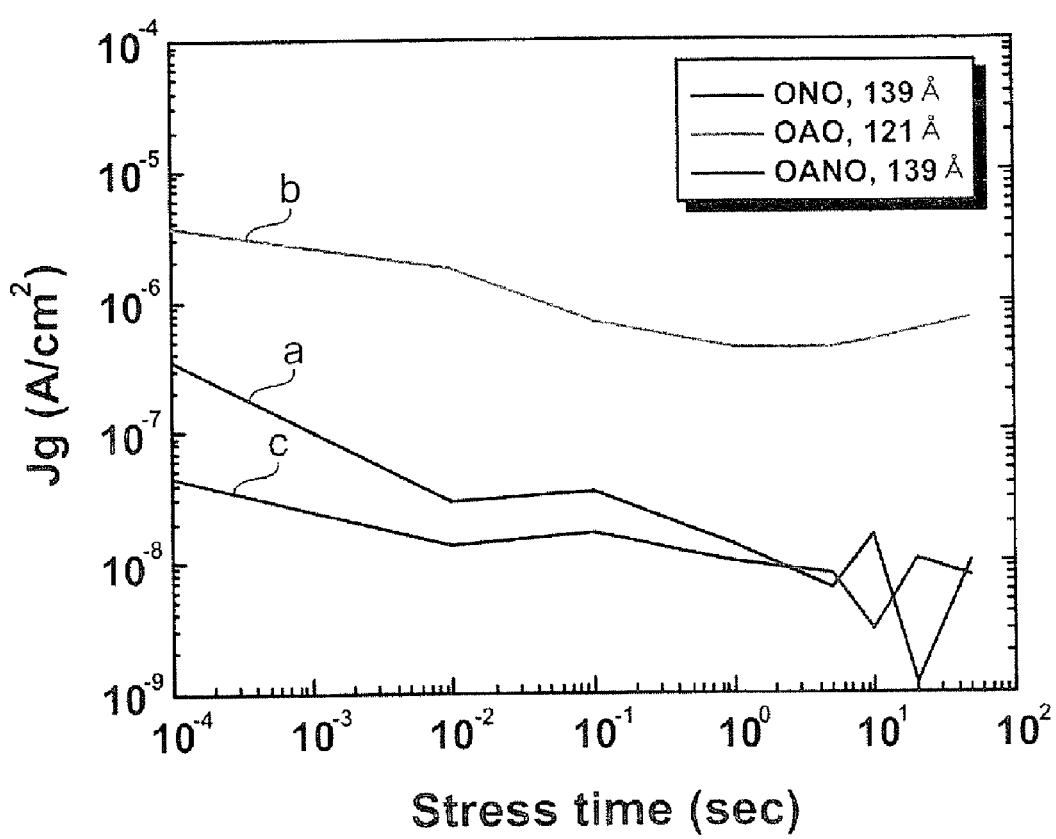
FIG. 10 is a graph showing the leakage current relative to the electrical stress in a third experimental example and first and second comparative examples.

An electrical stress of 10 MV/cm was generated and measurements were carried out to determine the change in leakage current relative to increased stress time. As illustrated in FIG. 10, the GAO laminated structure b showed deterioration of the dielectric layer and stress-induced leakage current (SILC) phenomenon as the electrical stress time was increased. The ONO laminated structure a represents the resistivity relative to the electrical stress, and the OANO laminated structure c has a stress resistivity that is close to the ONO laminated structure a.

Figure 11:
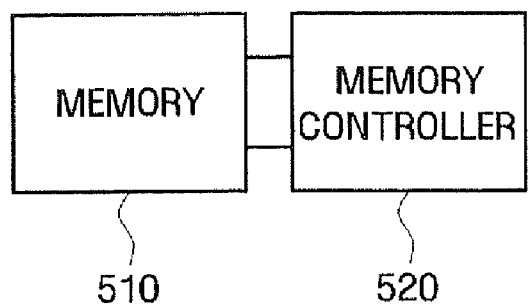
FIGS. 11 to 13 are conceptual diagrams explaining operation of a nonvolatile memory device according to some embodiments of the present invention.
Figure 12:
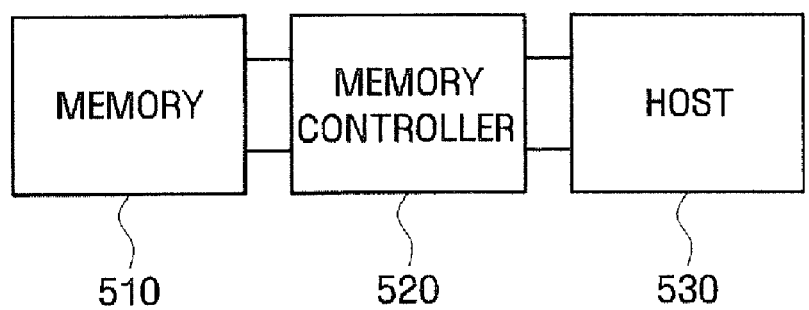
Figure 13:
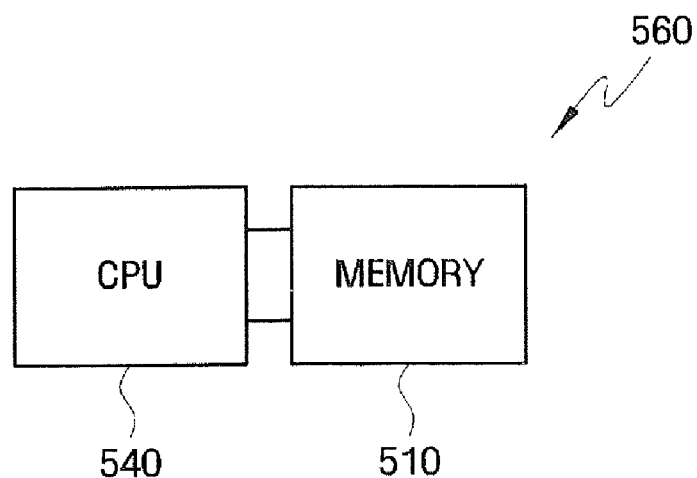

FIGS. 11 to 13 are conceptual diagrams that illustrate operation of a nonvolatile memory device according to some embodiments of the present invention.

Referring to FIG. 11, a system according to some embodiments of the present invention includes a memory 510 that is connected to a memory controller 520. The memory 510 is a nonvolatile memory device formed according to the various embodiments of the present invention as described above, and the memory controller 520 provides input signals corresponding to the control of the operation of the memory, for example, a command signal for controlling a read operation and a write operation and an address signal, to the memory 510.

The system including the memory 510 and the memory controller 520, for example, may be embodied into an electronic card such as a memory card. Specifically, the system according to an embodiment of the present invention can be embodied in a card which satisfies a specified industry standard and may be included in, for example, a portable phone, a two-way communication system, a one-way pager, a two-way pager, a personal communication system, a portable computer, a personal data assistance (PDA), an audio and/or video player, a digital and/or video camera, a navigation system, a global positioning system (GPS), and the like. However, the use of the system according to an embodiment of the present invention is not limited thereto, and the system, for example, may be embodied in diverse forms such as a memory stick and so on.

Referring to FIG. 12, a system according to another embodiment of the present invention may include a memory 510, a memory controller 520, and a host 530. Here, the host 530 is connected to the memory controller 520 through a bus and so on, and provides a control signal to the memory controller 520, so that the memory controller 520 can control the operation of the memory 510. The host 530, for example, may be a processor used in a portable phone, a two-way radio communication system, a one-way pager, a two-way pager, a personal communication system, a portable computer, a PDA, an audio and/or video player, a digital and/or video camera, a navigation system, a GPS, and the like.

In FIG. 12, the memory controller 520 is interposed between the memory 510 and the host 530. However, the position of the memory controller 520 is not limited thereto, and in the system according to still another embodiment of the present invention, the memory controller 520 may be selectively omitted.

Referring to FIG. 13, a system according to still another embodiment of the present invention may be a computer system 560 composed of a central processing unit (CPU) 540 and a memory 510. In the computer system 560, the memory 510 is connected to the CPU 540 directly or using a typical computer bus architecture. The memory 510 may store an operation system (OS) instruction set, a basic input/output start up (BIOS) instruction set, an advanced configuration and power interface (ACPI) instruction set, and the like, or may be used as a large-capacity storage device such as a solid state disk (SSD).

For convenience in explanation, all constituent elements included in the computer system 560 are not illustrated in FIG. 13. Also, for convenience in explanation, the memory controller 520 between the memory 510 and the CPU 540 is omitted in FIG. 11. However, in still another embodiment of the present invention, the memory controller 520 may be interposed between the memory 510 and the CPU 540.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:
1. A nonvolatile memory device comprising:
a tunneling layer on a substrate;
a floating gate on the tunneling layer;
an inter-gate dielectric layer structure on the floating gate, the inter-gate dielectric layer structure comprising a first silicon oxide layer, a high dielectric layer on the first silicon oxide layer, and a second silicon oxide layer on the high dielectric layer opposite to the first silicon oxide layer; and a control gate on the inter-gate dielectric layer structure;

wherein the high dielectric layer comprises first and second high dielectric layers laminated on each other, and the first high dielectric layer comprises a material having a lower density of electron trap sites and a larger energy band gap or conduction band-offset than the second high dielectric layer;

wherein the first high dielectric layer is directly on the first silicon oxide layer and the second silicon oxide layer is directly on the second high dielectric layer.

2. The nonvolatile memory device of claim 1, wherein the density of electron trap sites of the first high dielectric layer is not more than half of the density of electron trap sites of the second high dielectric layer, and the density of electron trap sites of the first high dielectric layer is not more than 1019/cm3.

3. The nonvolatile memory device of claim 1, wherein the first high dielectric layer comprises an aluminum oxide layer or an aluminum oxynitride layer, and the second high dielectric layer comprises a silicon nitride layer or a silicon oxynitride layer.

4. The nonvolatile memory device of claim 3, wherein the silicon nitride layer or the silicon oxynitride layer is laminated on the aluminum oxide layer or the aluminum oxynitride layer.

5. The nonvolatile memory device of claim 4, wherein the aluminum oxide layer or the aluminum oxynitride layer is further laminated on the silicon nitride layer or the silicon oxynitride layer.

6. The nonvolatile memory device of claim 3, wherein the floating gate includes polysilicon doped with n-type or p-type impurities.

7. A method of manufacturing a nonvolatile memory device, the method comprising:

forming a tunneling layer on a substrate;

forming a floating gate on the tunneling layer;

forming an inter-gate dielectric layer structure by sequentially laminating a first silicon oxide layer, a high dielectric layer, and a second silicon oxide layer on the floating gate; and forming a control gate on the inter-gate dielectric layer structure;

wherein formation of the high dielectric layer comprises forming a first high dielectric layer on the first silicon oxide layer and forming a second high dielectric layer on the first high dielectric layer, wherein the first and second high dielectric layers each comprise materials having a different density of electron trap sites and different energy band gap or a different conduction band-offset than each other.

8. The method of claim 7, wherein the second high dielectric layer has a lower density of electron trap sites than the first high dielectric layer and a larger energy band gap or conduction band-offset than the first high dielectric layer.

9. The method of claim 7, wherein the first high dielectric layer comprises an aluminum oxide layer or an aluminum oxynitride layer, and the second high dielectric layer comprises a silicon nitride layer or a silicon oxynitride layer.

10. The method of claim 7, further comprising forming a third high dielectric layer, which has a lower density of electron trap site than the second high dielectric layer and a larger energy band gap or conduction band-offset than the second high dielectric layer, on the second high dielectric layer after forming the second high dielectric layer.

11. The method of claim 7, wherein the density of electron trap sites of the first high dielectric layer is not more than half of the density of electron trap sites of the second high dielectric layer, and the density of electron trap sites of the first high dielectric layer is not more than 1019/cm3.

12. A nonvolatile memory device comprising:

a tunneling layer on a substrate;

a floating gate on the tunneling layer;

an inter-gate dielectric layer structure on the floating gate, the inter-gate dielectric layer structure comprising a first silicon oxide layer, a high dielectric layer on the first silicon oxide layer, and a second silicon oxide layer on the high dielectric layer opposite to the first silicon oxide layer; and a control gate on the inter-gate dielectric layer structure;

wherein the high dielectric layer comprises first and second high dielectric layers laminated on each other, and the density of electron trap sites of the first high dielectric layer is not more than half of the density of electron trap sites of the second high dielectric layer, and the density of electron trap sites of the first high dielectric layer is not more than $1019/cm^3$;

wherein the first high dielectric layer is directly on the first silicon oxide layer and the second silicon oxide layer is directly on the second high dielectric layer.

13. The nonvolatile memory device of claim 12, wherein the first high dielectric layer has a larger energy band gap or conduction band-offset than the second high dielectric layer.

14. The nonvolatile memory device of claim 12, wherein the first high dielectric layer comprises an aluminum oxide layer and/or an aluminum oxynitride layer, and the second high dielectric layer comprises a silicon nitride layer and/or a silicon oxynitride layer.

15. The nonvolatile memory device of claim 14, wherein the silicon nitride layer and/or the silicon oxynitride layer is laminated on the aluminum oxide layer and/or the aluminum oxynitride layer.

16. The nonvolatile memory device of claim 15, wherein the aluminum oxide layer or the aluminum oxynitride layer is further laminated on the silicon nitride layer or the silicon oxynitride layer.

17. The nonvolatile memory device of claim 14, wherein the floating gate includes polysilicon doped with n-type or p-type impurities.

* * * * *